United States Patent [19]
Eckels et al.

[11] Patent Number: 6,011,396
[45] Date of Patent: Jan. 4, 2000

[54] ADJUSTABLE INTERVENTIONAL MAGNETIC RESONANCE IMAGING MAGNET

[75] Inventors: Phillip William Eckels; Wanxian Wang, both of Florence, S.C.; Bruce D. Collick, Madison, Wis.; Kazuhiko Hayakawa, Kawasak, Japan; Kazuya Hoshino, Sagamihara, Japan; Yuji Inoue, Hachioji, Japan

[73] Assignee: General Electric Company, Milwaukee, Wis.

[21] Appl. No.: 09/002,465

[22] Filed: Jan. 2, 1998

[51] Int. Cl.[7] .................................................. G01V 3/00
[52] U.S. Cl. .................. 324/319; 324/300; 324/307; 324/309; 324/320; 600/415
[58] Field of Search ..................... 324/318, 309, 324/320, 319, 307, 300; 335/299, 216, 298; 600/415, 421

[56] References Cited

U.S. PATENT DOCUMENTS

| | | | |
|---|---|---|---|
| 4,875,485 | 10/1989 | Matsutani et al. | 128/653 |
| 5,153,546 | 10/1992 | Laskaris | 335/216 |
| 5,623,241 | 4/1997 | Minkoff | 335/296 |

*Primary Examiner*—Donald E. McElheny, Jr.
*Assistant Examiner*—Brij B. Shrivastav
*Attorney, Agent, or Firm*—Irvine M. Freedman; Christian G. Cabou; Phyllis Y. Price

[57] ABSTRACT

An open architecture magnetic resonance imaging permanent magnet assembly with moveable magnets and adjustable field inclination with automatic magnetic field homogeneity shimming to enhance imaging and positioning of the magnetic field about the portion of the patient to be imaged while enabling interventional physician access.

38 Claims, 7 Drawing Sheets

FIG_2

FIG_3

FIG. 4

FIG_5

FIG_6

FIG_7

FIG_10

ADJUSTABLE INTERVENTIONAL MAGNETIC RESONANCE IMAGING MAGNET

BACKGROUND OF INVENTION

This invention relates to an open architecture superconducting magnet assembly for a magnetic resonance imager (hereinafter called "MRI"), and more particularly to an adjustable, versatile assembly which facilitates interventional procedures.

Most MRI equipments utilize solenoidal magnets enclosed in cylindrical structures with a central bore opening for patient access. However, in such an arrangement, the patient is practically enclosed in the warm bore, which can induce claustrophobia in some patients. The desirability of an open architecture in which the patient is not essentially totally enclosed has long been recognized. Unfortunately, an open architecture structure poses a number of technical problems and challenges. Such an arrangement must still be capable of generating the very uniform yet strong magnetic fields required.

Another important application of open MRI magnet assemblies is for interventional procedures wherein the physician or surgeon can access the patient for such procedures while observing the display of a selected internal portion of the patient such as the region being operated on or treated for example, by lasers or by surgical instruments or mechanisms inserted into the patients blood vessels or organs.

Such procedures require open space for the surgeon to operate and simultaneous optimum MRI display viewing of the selected region of the patient receiving the operation. These at times conflicting objectives may require an adjustable magnet assembly in which the positioning of the magnets forming the imaging area magnet field is adjustable about a patient supported in various positions and inclinations. The magnet assembly at the same time needs to provide a sufficiently strong and homogenous field in the imaging region, and adjustment of the magnetic field orientation.

In addition, it is highly desirable that such selective adjustments enable the positioning of the magnet assembly on animals in veterinary applications and patients who may be in a wheel chair, on a table and/or in various inclinations to facilitate maximum surgeon intervention space while at the same time providing enhanced surgeon viewing.

SUMMARY OF INVENTION

It is therefore desirable to provide an improved adjustable magnet structure for an open architecture MRI which facilitates healthcare worker access and patient imaging for interventional procedures.

It is also desirable to provide a moveable portable magnet structure for an open architecture MRI which can be positioned around patients supported in various positions and inclinations.

It is further desirable to provide a simple shimming arrangement in an open architecture, MRI magnet which facilitates adjustments of magnetic field shimming at a plurality of magnetic field inclinations.

In accordance with one form of the invention, an open architecture superconducting MRI magnet assembly utilizes a pair of separated permanent magnets which provide a magnetic field and an imaging volume in the patient space between the magnets. A closed ferromagnetic path forms a generally C-shaped magnet structure which is selectively adjustable about a plurality of axes parallel to the MRI base in order to selectively control the inclination of the magnetic field from at least the vertical to the horizontal and to optimize the imaging of a patient in the imaging area. Motor driven gearing is used to control movement of the magnets. The control of current flow through a plurality of shimming coils adjacent to the imaging area provides corrections for magnetic field inhomogeneities at the selected magnetic field inclination and position.

More particularly, a visual MRI display including reconstructed visual display at the magnet assembly enables real-time interventional procedures by a physician or surgeon. The assembly may be more portable by mounting on a shielded direct current motorized moveable base, and shimming means are provided to enable magnetic homogeneity in the imaging volume at the magnetic field inclination selected.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

Figure 1:
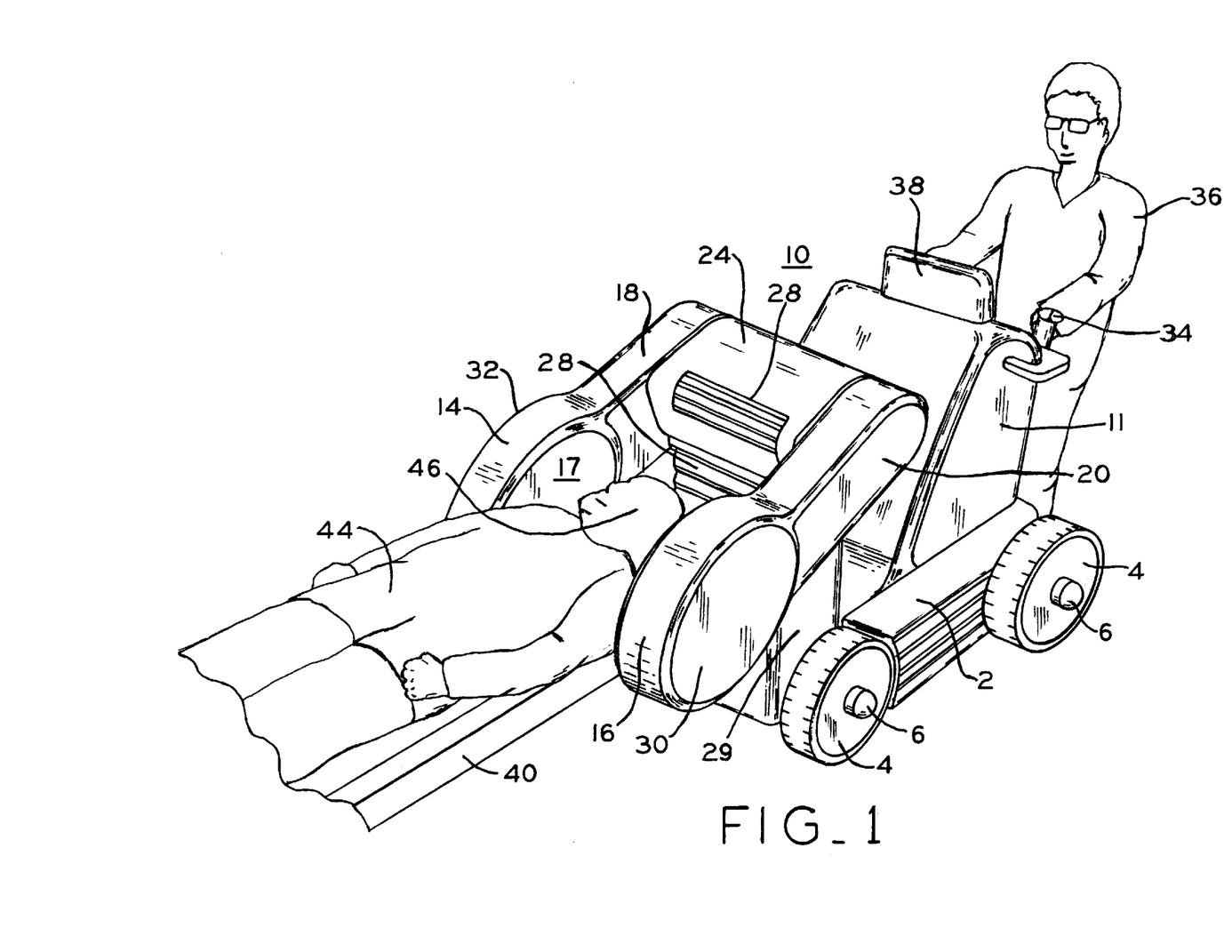
FIG. 1 shows a versatile moveable and adjustable MRI magnet assembly in accordance with the present invention.
Figure 2:
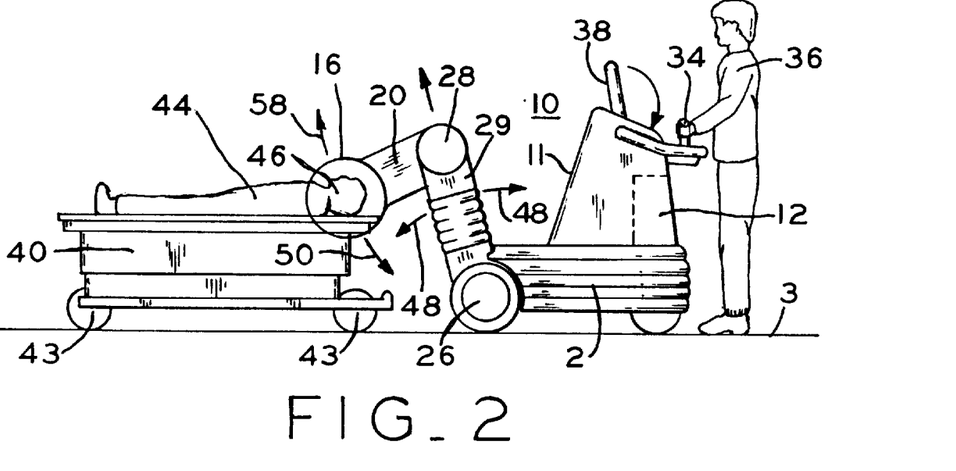
FIGS. 2 and 3 are simplified drawings, partially in cross section illustrating the adjustability of the magnet assembly shown in FIG. 1 and in which the patient is differently positioned.
Figure 3:
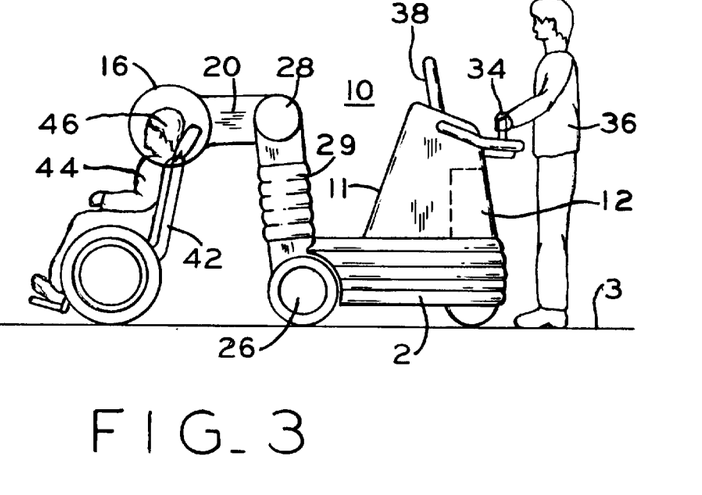

Referring first to FIGS. 1–3, a portable magnet assembly 10 includes a base 2 supported on wheels 4 driven by direct current electric motors indicated generally as 6. Housing 11 on base 2 includes the power source such as rechargeable batteries shown generally within the dotted areas 12 of FIGS. 2 and 3.

A pair of spaced apart permanent magnets 14 and 16 define imaging volume 21 therebetween and establish a strong unified magnetic field in the imaging volume. A magnetic flux path between magnets 14 and 16 is provided by arms or members 18 and 20 and flux path member 24 all of which are ferromagnetic material to complete the magnetic path between the magnets. A pair of gear drive assemblies or rotatable couplings 26 and 28 are positioned at each end of adjustable magnetic positioning member 29. Rotatable coupling 26 interconnects base 2 and magnetic positioning member 29 while rotatable coupling 28 interconnects the magnetic positioning member and magnetic flux path member 24. Rotatable coupling 26 provides movement of magnetic positioning member 29 in the direction indicated by arrows 48 (see FIG. 2) while rotatable coupling 28 provides rotation of arms 18 and 20, and magnets 14 and 16, respectively, in the direction shown by arrows 50. The combined adjustability made possible through rotatable couplings 26 and 28 facilitates the selective positioning of magnets 14 and 16 about a desired portion, such as the head 46 of a patient 44 on a horizontal patient support 40 (see FIG. 2) which support may be a Trandelinberg mobile table which is moveable along floor 3 on mobile table wheels 43.

A patient may be examined while in alternate patient support such as wheelchair 42. The driving assemblies or rotatable couplings 26 and 28 may conveniently comprise a direct current motor driven gear chain (described in more detail below) powered by rechargeable batteries 12 and controlled by healthcare provider 36 which may be a technician, physician, or a surgeon operating controls shown generally as 34 to position magnet assembly 10 and permanent magnets 14 and 16 in the desired position for the MRI examination of patient 44 whether on a horizontal support or in a wheelchair. A visual display or indicator 38 assists healthcare giver 36 to properly position permanent magnets 14 and 16, and in addition to control the rotation and hence the orientation of the magnets such that the orientation or inclination of the magnetic field therebetween can be adjusted over 90 or more degrees. As a result, the inclination of the magnetic flux lines or field B can be adjusted from the vertical to the horizontal relative to floor 3, or over a greater range, including any selected position therebetween.

A magnetic shimming assembly comprising a plurality of magnetic members is carried in trays or drawers shown generally as 30 and 32 for movement along with their respective permanent magnetic 14 and 16. For each preset position of the magnetic field other predetermined magnetic members may be added to drawer assemblies 30 and 32. For a more detailed discussion of a suitable magnetic shimming assembly to improve the homogeneity of the magnetic field within imaging volume 21, see U.S. Pat. No. 5,389,909 entitled "Open Architecture Magnetic Resonance Imaging Passively Shimmed Superconducting Magnet Assembly", assigned to the same Assignee as the present invention.

However, it may be necessary to fine tune or reshim the magnetic field homogeneity of imaging volume 21 for each of the preset positions of the magnetic field. This may be accomplished rapidly and accurately through use of the shimming arrangement shown in FIG. 10.

Figure 10:
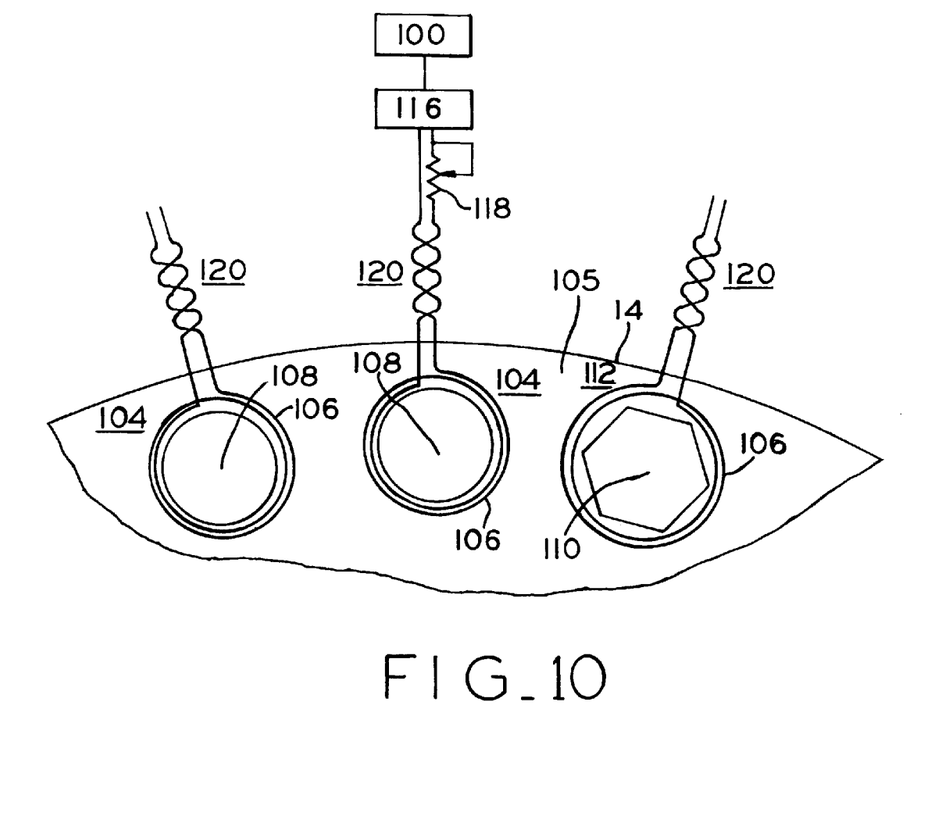
FIG. 10 is a partial view of a magnet pole face illustrating the shimming arrangement for adjusting magnetic field homogeneity for changing magnetic field positions.

Referring to FIG. 10, direct current shim members such as 104 are positioned over or embedded in the face 105 of one or both of magnets 14 and 16 adjacent imaging volume 21. Shim members 104 include windings 106 surrounding an iron laminate pin or cylinder 108 which could alternatively utilize a hexagonal or other polygonal cross-section such as the hexagon cross-section 110 of shim member 112 to enable a greater density or closer packing of the shim members on the face 105. A dense packing is not shown in FIG. 10 but may be desirable for increased magnetic field homogeneity. Windings 106 are each connected to a variable direct current voltage source 116 via bifilar twisted leads 120 to control the superconducting current flow through the bifilar windings and to vary the flow for each preset position of the magnetic field. Computer 100 (see FIG. 8) may be programmed to provide the desired bifilar current flow for each of the shim coils at each of the preset positions of the magnetic field. The bifilar wound leads cancel undesired magnetic fields and forces that current flow though the leads might otherwise introduce and which could disturb the homogeneity of the magnetic field in imaging volume 21 between magnets 14 and 16.

Although not shown in FIG. 10, the ends of all of the shim coils 106 would be connected to a direct current voltage source such as 116 controlled by computer 100 to provide the proper current for each preset or new position of the magnetic field. Depending on magnet configuration multiple coils at scattered locations could be connected to the same voltage source with the shimming current flow there through controlled by computer 100 varying the resistance in series with the voltage source. The computer controlled shimming could provide an automatic second fine tuning of magnetic field homogeneity after a patient was positioned between magnets 14 and 16 to further enhance the quality of the imaging.

Figure 4:
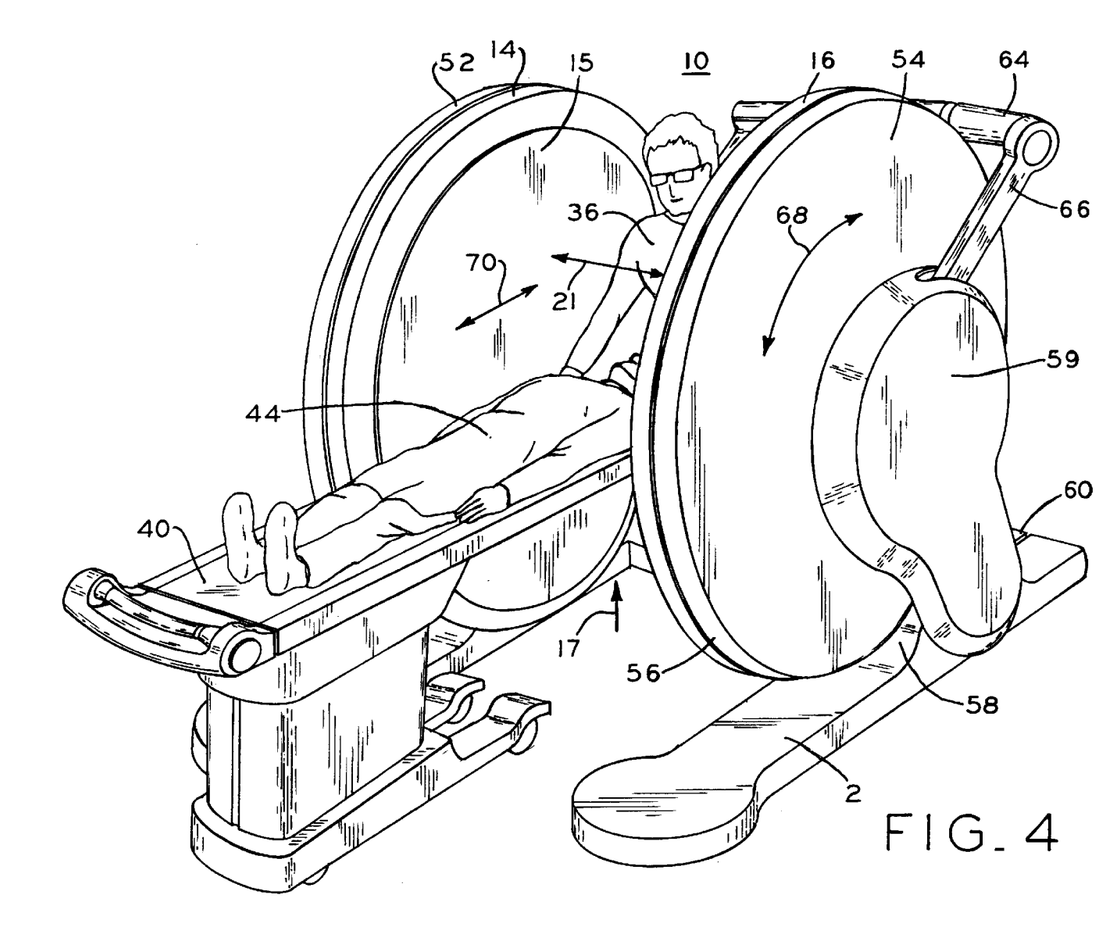
FIG. 4 illustrates a larger magnet assembly with a simplified magnet adjustment mechanism.
Figure 5:
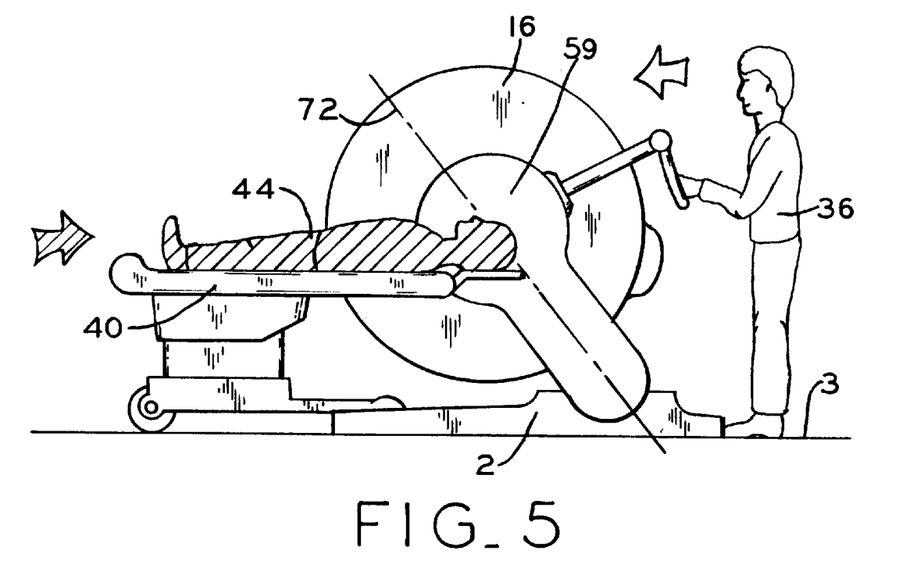
FIGS. 5 and 6 are simplified drawings, partially in cross section, showing various illustrating the magnetic field inclination adjustment possible with the arrangements of FIG. 4 or FIG. 1.
Figure 6:
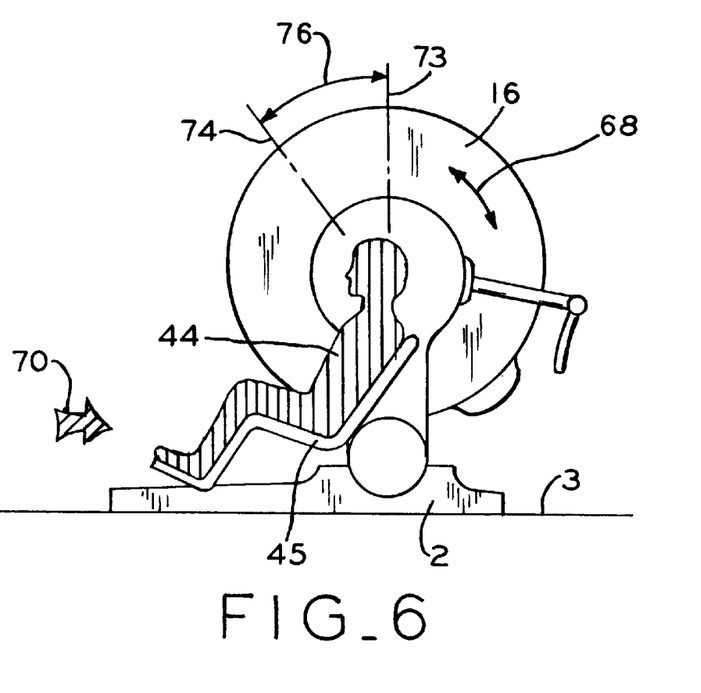

FIG. 4 shows a larger non-portable magnet assembly 10 without wheels 4 but with a simplified magnetic adjustment drive. Referring to FIGS. 4–6, base 2 is secured to, or positioned directly on, floor 3 such that patient 44 is moved between permanent magnets 14 and 16 on a horizontal support such as shown in FIGS. 4 and 5, or else seated in a tiltable seat 45. Non-ferromagnetic coupling gears 52 and 54 including gear teeth such as those indicated generally as 56 which mesh with gear teeth 58 on base 2 and which also provide part of the magnetic return path between magnets 14 and 16. Permanent magnets 14 and 16 may be rotated manually by control 64 on lever arms 66 as shown in simplified form in FIG. 5 or may be rotated by a motor driven gear drive shown generally as 59. Magnet assembly 10 thus can be rotated as indicated by arrow 68 around patient 44 who may be positioned within imaging volume in the central region between permanent magnets 14 and 16 as indicated by arrow 21 and raised or lowered by adjustment of patient support 40. Dotted lines 72, 73 and 74 in FIGS. 5 and 6 indicate selectively controllable inclination and orientation of the magnetic field between magnets 14 and 16 in imaging volume or region 21, while arrow 76 illustrates movement or adjustment of the magnetic field inclination indicated by arrow 17 (see FIG. 4) from the vertical to a position approximately 45 degrees to vertical to improve imaging of a particular area of patient 44.

Figure 7:
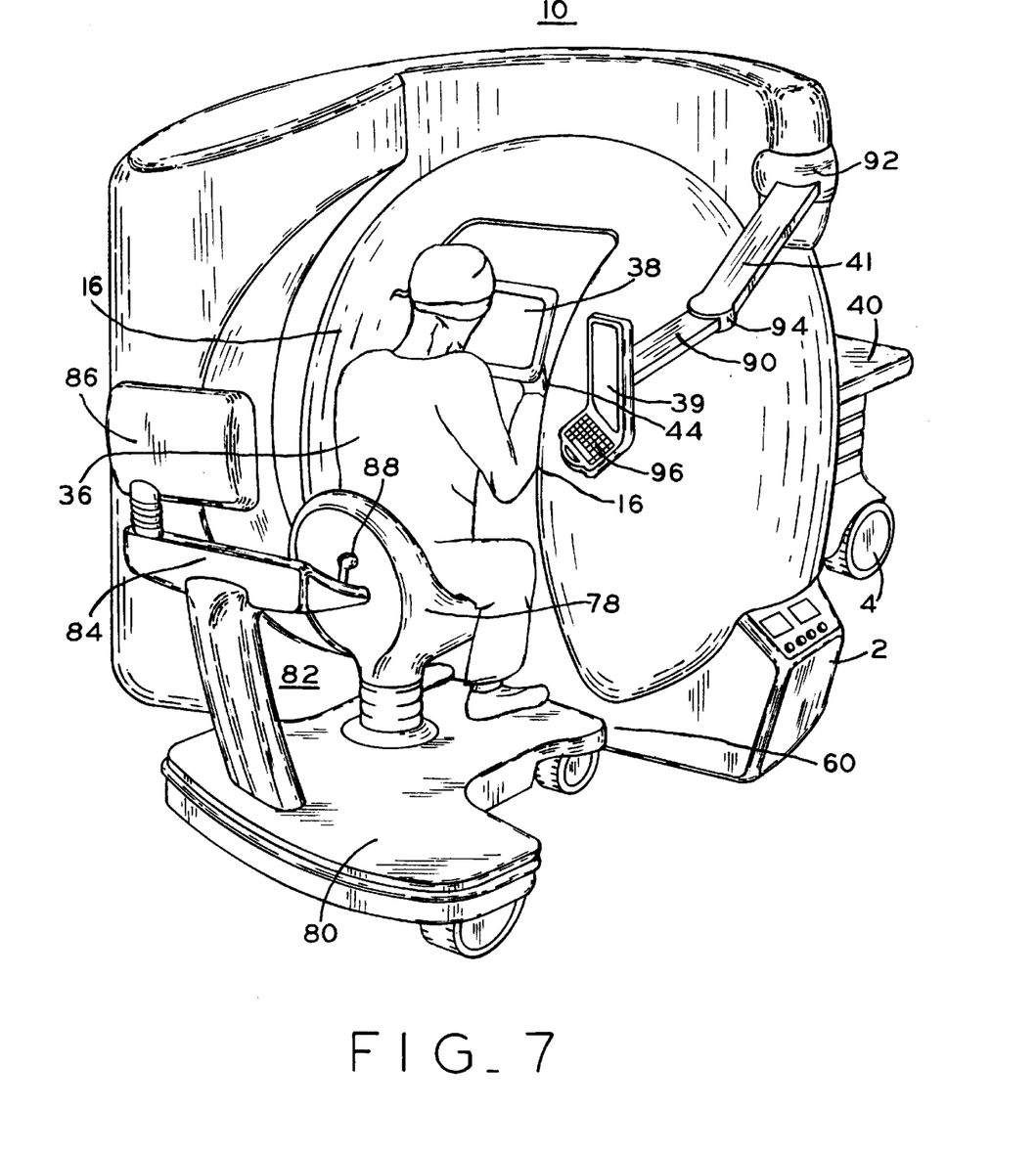
FIG. 7 illustrates surgeon positioning and viewing of the patient for interventional procedure of the magnet assembly of FIGS. 1–6.

FIG. 7 illustrates the access by a physician or surgeon 36 to patient 44 on patient support 40. Patient support 40 extends between the magnets to the imaging region 21 such that patient 44 being imaged is directly accessible to the physician or surgeon 36 for interventional procedures. Such interventional procedures may include surgery, the positioning of surgical devices or sensors within the body such as in a vein or artery, and the implantation of medical devices within patient 44. Such procedures are facilitated by providing the surgeon with one or more video displays formatted and integrated by the MRI system as described in more detail below regarding FIG. 8. Visual display 38 can be a conventional display from the MRI imaging system while visual display 39, could be, for example, a three-dimensional blood vessel reconstruction provided by the MRI computer. That is, the surgeon can be provided with real time magnetic resonance imaging to facilitate and enable internal procedures in which direct visual observation by the surgeon is inadequate.

As further shown in FIG. 7, surgeon 36 is seated on adjustable seat 78 on moveable platform 80 of surgeon's station 82 which also includes a surgeon's control panel 84, indicators 86 and controls such as 88 to enable the surgeon to position and adjust permanent magnets 14 and 16 to provide the optimum imaging of patient 44. Visual display 39 may be adjustably positioned by adjustment of articulated boom members 41 and 90 about adjustable joints 92 and 94. Control panel 96 on visual display 39 enables surgeon 36 to select the particular display desired from the MRI computer 100 (shown in FIG. 8).

Figure 8:
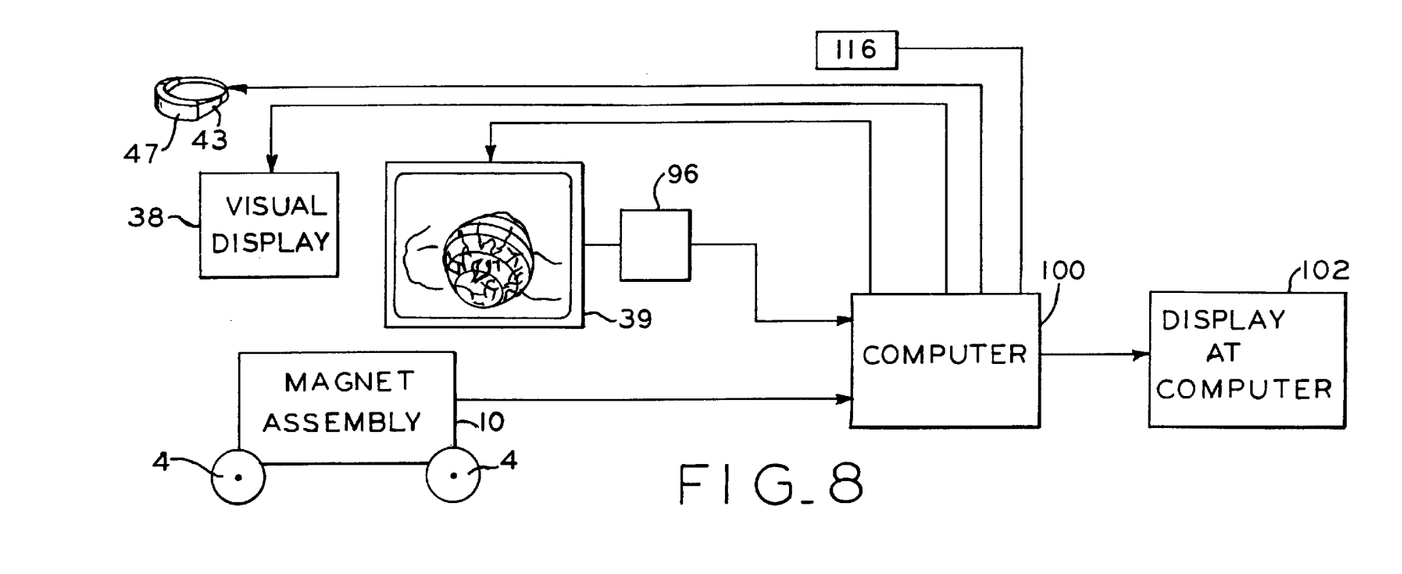
FIG. 8 is a drawing partially in block diagram form and partially in pictorial form to illustrate the interconnection of the various elements of FIGS. 1–7.

Referring next to FIG. 8. FIG. 8 is a block diagram, partially in pictorial form which better illustrates the electrical interconnection of the components shown in FIGS. 1–7. Magnet assembly 10 is connected to computer 100 with its associated display 102. Computer 100 also generates the desired display at magnet assembly 10, which if mobile will include wheels 4. These displays include visual display 38 which may be the same or essentially the same as that shown by display 102 at computer 100. Computer 100 also provides visual display 39 with 3-dimensional blood vessel reconstruction images or other images as selected by control 96 associated with the visual display. Display 39 shows a simplified sketch of the type of display which may be selected. In addition, a further optional display may include a head mounted display 47 which may be worn by surgeon 36 through use of resilient band 43 in the same manner as goggles or eyeglasses, or positioned over the surgeon's eyeglasses This enables surgeon 36 to avoid having to look up or away at a display such as 39 during interventional procedures on patient 44.

Figure 9:
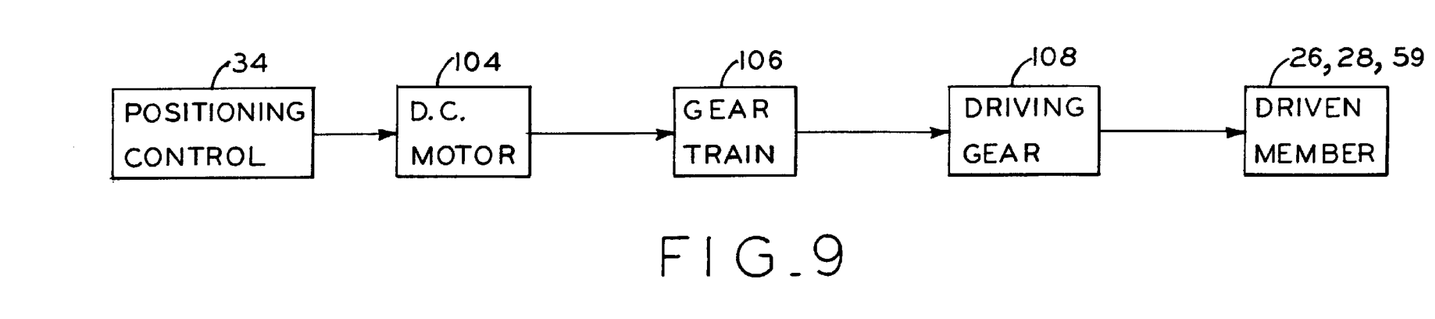
FIG. 9 is a block diagram illustrating a drive assembly utilized in the magnet positioning adjustments of FIGS. 1–8.

FIG. 9 is a block diagram showing one form of a rotatable coupling or gear drive assembly such as 26, 28 and 59. Direct current motor 104 is controlled by positioning control 34 and connected gear train 106 and driving gear 108 to the driven member which may be part of rotatable coupling 26 at base 2, or part of rotatable coupling 28 at the end of arms 18 and 20, or rotatable coupling 59 which directly rotates magnets 14 and 16.

It is thus to be seen that the present invention provides a flexible, adjustable magnet assembly for MRI imaging and interventional procedures providing mobility, adjustability, positioning and magnetic field 17 rotational capabilities for permanent magnets 14 and 16 which define imaging volume 21 of magnet assembly 10. This enables healthcare worker 16 to position patient 44 in a sitting prone or inclined position while at the same time positioning and orienting magnets 14 and 16 and the resultant magnet field 17 in imaging volume 21 at the desired inclination or orientation to enhance both the imaging of the patient and the accessibility of the patient to the surgeon for interventional procedures. A 45 degree orientation may be desirable, for example, for the imaging of knees, while a thirty degree field orientation may be desirable for an MRI guided biopsy of the spine of a prone patient. Magnetic field orientations which are intermediate the vertical and horizontal of the main axis of the human body provide better access to the human body for medical interventional procedures.

Orienting magnetic field inclination 17 transverse to human body 44 but parallel to the plane of floor 3 allows for the structural supports maintaining the gap between the magnet halves to be arranged at different positions. In general, the positions of the structural supports will be selected to give the maximum open space in the vertical direction, however, selection of these positions is determined by the need to position human body or patient 44 for the selected medical procedure. The flexibility possible with adjustable magnet assembly 10 facilities imaging of people that cannot maintain a lying position, increases patient support possibilities including typical weight bearing positions for medical evaluation. A vertical access configuration allows patient entry from one side of the system with comparable access for the clinician 36 from the other side (as shown in FIGS. 4 and 7) for direct manipulation of patient 44. Different applications are optimized by the transportability and adjustability of the same magnet assembly 10 to the position most appropriate for the imaging of selected application with the shimming system optimizing the quality of the image for the selected position.

While only certain features of the invention have been illustrated and described herein, modifications and changes will occur to those skilled in the art. It is, therefore, to be understood that the appended claims are intended to cover such modifications and changes that fall within the true spirit of the invention.

What we claim is:

1. An open architecture magnet assembly with selectively adjustable magnetic field orientation with patient accessible magnetic resonance imaging enabling interventional procedures comprising:

said magnetic assembly being supported on a base;

a pair of spaced apart permanent magnet pole faces supported on said base providing a magnetic field and imaging volume in the space between said magnets;

at least one member extending between said magnets outside said imaging volume to provide a magnetic flux return path therebetween;

said magnet being selectively adjustable about a plurality of axes which is substantially parallel to said base to selectively control the orientation of said magnetic field in said imaging area relative to said base to enable optimization of the imaging of a selected region of said patient in said imaging volume; and adjustable means to automatically correct the magnetic field inhomogeneity within said imaging volume at a plurality of selected orientations and positions of said magnetic field;

said means to adjust said magnetic field homogeneity including a plurality of adjustable magnetic shimming coils on at least one of said magnets adjacent to said imaging volume with automatic current flow provided through the shimming coils at each said selected position of said magnetic field.

2. The magnet assembly of claim 1 wherein said orientation of said magnetic field is adjustable for at least approximately ninety degrees.

3. The magnet assembly of claim 2 wherein said approximately ninety degrees extends from approximately the vertical to the horizontal relative to said base and said shimming coils are bifilar wound.

4. The magnet assembly of claim 3 wherein the adjustment of said magnets is through a gear assembly including a first set of gear teeth secured to said base cooperating with a second set of gear teeth secured to the supports for said magnets.

5. The magnetic assembly of claim 4 wherein a second set of gear teeth are provided on said member between said magnets enabling rotations of sad magnets over at least ninety approximately degrees about two axes parallel to said base.

6. The magnet assembly of claim 5 wherein said magnet assembly can be rotated from the vertical to the horizontal direction relative to said base.

7. The magnet assembly of claim 6 wherein said magnet assembly includes at least two gear assemblies, the first of which includes stationary gear teeth on said base.

8. The magnet assembly of claim 7 wherein said first gear assembly is connected to a rotatable member which is connected at the distal end thereof through a second gear assembly to said magnet assembly.

9. The magnet assembly of claim 7 wherein said gear assemblies include gear teeth connected to at least one of said magnets and two sets of stationary gear teeth on said base each of which mesh with the gear teeth on said at least one of said magnets.

10. The magnet assembly of claim 2 wherein a computer controls the current for each of said shimming coils with predetermined current flows for preset positions of said magnets.

11. The magnet assembly of claim 10 wherein said shimming coils include a winding around a magnetic core for receiving current through a bifilar twisted lead pair.

12. The magnet assembly of claim 11 wherein said magnetic cores are laminated iron.

13. The magnet assembly of claim 12 wherein said laminated cores include a polygonal cross section.

14. The magnet assembly of claim 4 wherein said magnets are moveable in at least two dimensions.

15. The magnet assembly of claim 2 wherein said magnet assembly is supported on a support member and said magnets are rotatable about an axis to move the magnetic field between said magnets from at least a vertical field orientation relative to said support to a horizontal field orientation.

16. The magnet assembly of claim 15 wherein said at least one member is ferromagnetic material to provide a magnetic path between the ends of said remote from said space.

17. The magnet assembly of claim 3 wherein said magnets are adjustable about said base to optimize the accessibility of the physician to the patient positioned in said space.

18. The magnet assembly of claim 17 wherein patient support means are provided to position said patient in a position selected from the group of positions consisting of seated and lying.

19. The magnet assembly of claim 18 wherein the seated position is adjustable and includes a seat including a support portion the angle of which may be adjusted relative to said base.

20. The magnet assembly of claim 19 wherein said magnets are generally cylindrical in shape with an axial length significantly less than the circumference thereof.

21. The magnet assembly of claim 1 wherein said magnets are selectively moveable in two directions.

22. The magnet assembly of claim 21 wherein said magnets are connected to said base through at least two selectively rotatable couplings.

23. The magnet assembly of claim 22 wherein the first of said at least two couplings is secured to said base, and is connected to the second of said at least two couplings through a rigid connecting member.

24. The magnet assembly of claim 23 where each of said couplings is a motor driven gear coupling.

25. The magnet assembly of claim 24 wherein said base is moveable for positioning about a patient.

26. The magnet assembly of claim 25 including wheels on said base and an electric drive for selectively positioning said magnet assembly.

27. The magnet assembly of claim 26 including a rechargeable battery mounted on said base and direct current motors positioning said base and for driving said gear couplings.

28. The magnet assembly of claim 27 including controls for each of the motors of said magnet assembly.

29. The magnet assembly of claim 28 wherein the space between said magnets is selected to enable said magnets to surround a patient on a support selected from a seated position support and a substantially prone position support.

30. The magnet assembly of claim 1 wherein said magnet assembly includes at least two motor driven gear assemblies to position said permanent magnets and adjust said magnetic field orientation.

31. An open architecture magnet assembly with selectively adjustable magnetic field orientation with patient accessible magnetic resonance imaging comprising:
   said magnetic assembly being supported on a base;
   a pair of spaced apart permanent magnet pole faces supported on said base providing a magnetic field and imaging volume in the space between said magnets;
   at least one member extending between said magnets outside said imaging volume to provide a magnetic flux return path therebetween;
   said magnets being selectively adjustable about at least one axis which is substantially parallel to said base to selectively control the orientation of said magnetic field in said imaging area relative to said base to enable optimization of the imaging of a selected region of said patient in said imaging volume; and
   means to correct the magnetic field inhomogeneity within said imaging volume at the selected orientation of said magnetic field;
   wherein said orientation of said magnetic field is adjustable for at least approximately ninety degrees, and said means to adjust said magnetic field homogeneity includes a plurality of adjustable magnetic shimming coils on at least one of said magnets adjacent to said imaging volume;
   further including a visual magnetic resonance imager display located proximate to said magnet assembly to enable a health care worker to observe said display while engaging in an interventional procedure on a patient positioned between said magnets.

32. The magnet assembly of claim 31 wherein the rotation of said magnet assembly facilitates physician access to and viewing of selected portions of said patient for said interventional procedure.

33. The magnet assembly of claim 32 wherein said visual display is adjustably secured to said magnet assembly.

34. The magnet assembly of claim 32 wherein said visual display is configured to be worn on the head of said physical for movement therewith.

35. An open architecture adjustable magnet assembly for patient accessible magnetic resonance imaging comprising:
   said magnetic assembly being supported on a base;
   a pair of spaced permanent magnets on said base providing a magnetic field and defining an imaging volume in the space between said magnets;
   at least one member extending between said magnets and providing a magnetic flux path therebetween and spaced from said imaging volume;
   said magnets being positioned to provide a magnetic field axis substantially parallel to said base and said imaging area to enable optimization of the imaging of a selected region of said patient in said imaging area;
   wherein said axis and orientation of said magnetic field is adjustable for at least approximately ninety degrees, and means including magnetic shim coils are provided on at least one of said magnets to correct for magnetic field inhomogeneities at various orientations of said magnetic field; and
   wherein said approximately ninety degrees extends from approximately the vertical to the horizontal relative to said base.

36. The magnet assembly of claim 35 further including a visual magnetic resonance imager display located proximate to said magnet assembly to enable a health care worker to observe said display while engaging in an interventional procedure on a patient positioned between said magnets.

37. The magnet assembly of claim 36 further including a computer to provide reconstructed three dimensional images to said magnetic resonance imager display and to control the current flow through said magnetic shim coils at preselected orientations of said magnetic field.

38. The magnet assembly of claim 37 wherein said shim coils are positioned on the face of said magnet and are provided appropriate current flow as determined by said computer for each position of said magnets.

* * * * *